US006522076B2

(12) United States Patent
Goedicke et al.

(10) Patent No.: US 6,522,076 B2
(45) Date of Patent: Feb. 18, 2003

(54) PROCESS AND SWITCHING ARRANGEMENT FOR PULSING ENERGY INTRODUCTION INTO MAGNETRON DISCHARGES

(75) Inventors: Klaus Goedicke, Dresden (DE); Torsten Winkler, Radeberg (DE); Michael Junghähnel, Dresden (DE); Karsten Handt, Dresden (DE); Henry Güldner, Heindenau (DE); Henrik Wolf, Dresden (DE); Frank Eckholz, Dresden (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/817,346

(22) Filed: Mar. 27, 2001

(65) Prior Publication Data
US 2002/0047539 A1 Apr. 25, 2002

(30) Foreign Application Priority Data
Mar. 28, 2000 (DE) .......................... 100 15 244

(51) Int. Cl.[7] .............................. H05B 31/26
(52) U.S. Cl. .............................. 315/111.21; 204/192.12
(58) Field of Search ................ 315/111.21, 111.41, 315/111.81; 204/155, 192.1, 192.12, 298.01, 298.02, 298.08

(56) References Cited

U.S. PATENT DOCUMENTS

| 5,015,493 | A | * | 5/1991 | Gruen | 204/298.05 |
| 6,005,218 | A | * | 12/1999 | Walde et al. | 219/121.52 |
| 6,063,245 | A | * | 5/2000 | Frach et al. | 204/192.13 |
| 6,113,760 | A | * | 9/2000 | Kuriyama et al. | 204/298.02 |
| 6,132,563 | A | * | 10/2000 | Frach et al. | 204/192.13 |
| 6,340,416 | B1 | * | 1/2002 | Goedicke et al. | 204/192.12 |

FOREIGN PATENT DOCUMENTS

| DE | 3538494 | 5/1987 |
| DE | 3716428 | 11/1987 |
| EP | 0591675 | 4/1994 |

* cited by examiner

Primary Examiner—Don Wong
Assistant Examiner—Thuy Vinh Tran
(74) Attorney, Agent, or Firm—Greenblum & Bernstein, P.L.C.

(57) ABSTRACT

Process and control arrangement for introducing pulsing energy introduction into magnetron discharges. The process includes feeding a charge to the electrodes of a magnetron arrangement via a ignition source at a time $t_0$, and, after the feeding of the electric charge, determining an ignition of the magnetron discharge. The process also includes introducing a current, having a predetermined value, from a boost source at a time $t_1$, and, at a time $t_2$, separating the ignition source from the electrodes of the magnetron arrangement. The introduction of the current by the boost source continues for a certain duration $t_{EIN}$. The process also includes interrupting the introduction of the electric energy for a predetermined time $t_{AUS}$.

22 Claims, 3 Drawing Sheets

PROCESS AND SWITCHING ARRANGEMENT FOR PULSING ENERGY INTRODUCTION INTO MAGNETRON DISCHARGES

CROSS-REFERENCE TO RELATED APPLICATIONS

The present application claims priority under 35 U.S.C. §119 of German Patent Application No. 100 15 244.9, filed on Mar. 28, 2000, the disclosure of which is expressly incorporated by reference herein in its entirety.

BACKGROUND OF THE INVENTION

1. Field of the Invention

The invention relates to a process and a control arrangement for pulsing introduction of electric energy into a glow discharge of the magnetron type. These so-called magnetron discharges are widely used for performing plasma technological processes, in particular, for plasma treatment of surfaces and for vacuum coating of work pieces with thin layers using magnetron sputtering. Typical areas of application are the refining of glass, plastic, and metal surfaces in electronics, optics, engineering, and memory technology.

2. Discussion of Background Information

Plasmas for surface treatment and coating can be fed with direct current when the work pieces to be treated and/or the material to be deposited is electrically conductive. Thus, for instance, direct current spraying of metallic layered work pieces is widely used, [e.g., G. Kienel (Pub.) Vakuumbeschichtung Vol. 1, ch. 5, p. 127 ff, VDI-Verlag Düsseldorf, 1995; and R. A. Haefer:Oberflächen- und Dünnschicht-Technologie, Part I, Chap. 4, p. 56 ff. and chap. 6, p. 95 ff., Springer-Verlag 1987].

When non-metal materials are to be sputtered, a high-frequency plasma is suitable, which is preferably operated at a frequency of 13.56 MHZ (see above lit. and DE39 42 560 A1).

By introducing pulsed plasma of medium frequency for spraying (DE 252 205 A1, DE 38 02 852 C2), sweeping technical advancements were achieved in the reactive depositing of electrically insulating layers; in particular, considerably higher coating rates can be achieved and high energy loss in matching networks, unavoidable in high-frequency spraying, can be prevented.

For this purpose, it is known for a sine-shaped alternating current in the frequency range of about 10 to 100 kHz to be introduced into a plasma via an oscillating converter (DE 40 42 287 A1; DE 41 06 770 C2). This procedure has the disadvantage that the plasma discharge of the negative and the positive polarity cannot be controlled independently of each other. Additionally, the form of pulsing can be influenced only with difficulty, particularly with respect to a certain relation between pulse length and pulse pause. Thus, considerable disadvantages result for a number of applications which can lead to the plasma processes being impossible to perform.

It is known to perform magnetron discharges by introducing rectangularly shaped unipolar power impulses (DE 37 00 633 C1). However, no instructions for designing such power introduction are provided and no suitable control arrangements are given by which almost rectangular power impulses can be created for high-powered magnetron discharge.

It is known to use so-called voltage source converters for energy introduction (EP 0 534 068 A2, EP 0 692 550 A1). In the pulsed introduction of energy into magnetron discharge with frequencies in the range from about 10 to 100 kHz, the discharge stops after each pulse and has to be ignited anew during the subsequent pulse. When creating a rectangular voltage impulse using a voltage source converter, first the generating of charge carriers begins before the plasma ignites. After the plasma has been ignited, some of the voltage created by the voltage source converter, the so-called ignition voltage, is falling over the plasma. The inductive behavior of the voltage source converter and the entire arrangement as well as the difference between the applied voltage and the ignition voltage determine the increase in current after the ignition of the plasma so that a serrated current impulse with relatively slow speeds of current increase results in practical use. It is disadvantageous that this current progression with its slowly increasing discharge current presents a drastic limit for the average time of the discharge power that can be introduced into the discharge. Therefore, very high values of peak current are necessary in order to achieve a certain desired value of the discharge power. This corresponds to high requirements of the electronic control elements for the capability of carrying current and, thus, causes high expenses. High peak currents also connected to a high plasma concentration, which can sometimes cause instabilities in the plasma process, e.g., the occurrence of undesired arc discharge.

In these cases, the recognition and purposeful avoidance and/or cancellation of such arc discharges is difficult since high peak currents can hardly be differentiated from spikes in current as an arc discharge is beginning.

It is also known that pulsed plasma can be operated with such a current pulser (DE 44 38 463 C1; U.S. Pat. No. 5,718,813). Here, a constant discharge current is introduced during the pulse phase in order to overcome the above-mentioned disadvantages. However, one disadvantage of this process using a current pulser is that, during the introduction of the predetermined current, at the beginning of the discharge a very high voltage peak is created in each pulse during the initial generation of the voltage carriers until the primary ignition is achieved, since the current is carried by too few voltage carriers at first. The voltage reaches values that are a multiple of the ignition voltage of the discharge after the primary ignition. Voltages of such high values can cause destruction of electronic components.

Control arrangements are known which limit high voltage occurring due to the introduction of a constant current by buffering in a discharge network (DE 35 38 494 A1). Along with the control expense corresponding therewith a loss of power in the discharge network is caused, which is particularly unacceptable, for high discharge power, i.e., high discharge currents, as well, and presents a considerable disadvantage of such control arrangements.

It is further known to introduce energy into a magnetron discharge in form of pulse packets having different current directions (DE 197 02 187 A). Depending on the type of the pulser used, such processes also have the above-mentioned disadvantages that result from the manner of creating single pulses.

SUMMARY OF THE INVENTION

The present invention provides a process and a control arrangement for performing the process by which, in each pulse phase, i.e., immediately after a pulse pause as well, a maximal pulse power can be introduced at a predetermined current without causing considerable excess voltage. Therefore, a largely rectangular time progression of the current as well as the voltage of the introduced pulse is to be provided for the introduction of magnetron discharges even in frequency ranges in which the magnetron discharge stops after each pulse and must be reignited in the subsequent pulse.

Accordingly, the present invention relates to a process for pulsing energy introduction into magnetron discharges with a charge being fed to the electrodes of a magnetron arrangement by a ignition source at a time $t_0$. Further, after the feeding of the electric charge, an ignition of the magnetron discharge is determined, in that the introduction of the current, having a predetermined value, from a boost source begins at a time $t_1$, determined by the ignition of the magnetron discharge, in that, at a time $t_2$, also determined by the ignition of the magnetron discharge, the separation of the ignition source from the electrodes of the magnetron arrangement is performed. The introduction of the current by the boost source is continued for a certain duration $t_{EIN}$, in that the introduction of the electric energy is subsequently interrupted for a predetermined time $t_{AUS}$, and in the separate process elements are then repeated, beginning with the feeding of the charge by means of the ignition source.

For $t_1$, and $t_2$, the condition $t_2 \geq t_1$, is observed. Further, The electric charge of the ignition source and/or the predetermined value of the current of the boost source can be adjusted before or during operation. It is noted that durations $t_{EIN}$ and/or $t_{AUS}$ can be adjusted before or during operation. Still further, the ignition of the magnetron discharge is determined by the acquisition of the impedance of the magnetron discharge or the ignition of the magnetron discharge is determined by the acquisition of the light emissions of the magnetron discharge. The current direction of timewise subsequent pulses is the same, or the current direction of pulses is occurring after one another opposite. Moreover, the current direction of a number of pulses following one another the current direction is equal and, for the same or another number of pulses following one another, is opposite and in the change of current direction for the other pulses following one another occurs according to a predetermined program.

The present invention is also related to a control arrangement for performing the process according to instant invention. The control arrangement includes at least one ignition source, at least one boost source, and at least one control device, which can connect the ignition source and the boost source, either separately or in combination, to the electrodes of the magnetron arrangement. The arrangement also includes a device for acquiring the ignition of the magnetron discharge and a device for controlling the control device.

Further, the ignition source is a ignition source that can be adjusted. Alternatively, or additionally, the boost source is a boost source that can be adjusted.

Moreover, the ignition source includes an adjustable direct current source, with a positive pole of the direct current source being connected via a switch to a connector of a inductor and the other connector of the inductor to the first exit of the ignition source via a switch. A negative pole of the direct current source is connected to the second exit of the ignition source, positioned on a reference potential, with one diode being switched parallel to the serial connection of the switch and the inductor such that the cathode of the diode is connected to the positive pole of the direct current source. One diode is switched parallel to the switch such that its anode is connected to the first exit of the ignition source, and one diode is switched between the connection point of the switch on one side and the inductor and the relational potential on the other side, such that the anode of the diode is connected to the reference potential. The boost source includes an adjustable direct current source, with the positive pole of the direct current source being connected to the cathode of a diode and via a inductor to sides of the switches and anode of a diode. The negative pole of the direct current source and the other side of the switch are connected to the exit of the boost source and the reference potential, and the other side of the switch is connected to the anode of the diode and the cathode of the diode is connected to another exit of the boost source.

Moreover, the exits of the ignition source and the boost source are connected to a uni-phased converter in a full bridge switch control and the central clamps of the full bridge switch control are connected to the electrodes of the magnetron arrangement. Still further, the switches are IGBT, and the boost source and a buffer condenser is connected parallel to the direct current source.

The invention includes a control-technical separation of the phase in which the voltage carriers begin to generate, referred to as ignition in the following, from the phase of evenly progressing discharge after the primary ignition of the magnetron discharge. For this purpose, in addition to a current source which can insert a certain current, a separate voltage source is used, also referred to as the ignition source. At the beginning of the ignition $t_0$, the introduction of the energy occurs exclusively via the ignition source. An increasing generation of charge carriers develops in the discharge zone. When sufficient amounts of charge carriers are generated, the plasma ignites and the ignition voltage develops; additionally, starting at a time $t_1$, when sufficient amounts of charge carriers have been created, the energy introduction by the boost source continues. Since the introduction of power only starts at a predetermined current, after a sufficient amount of charge carriers have been generated, the voltage peaks that would otherwise occur at the beginning of the pulse are prevented. Thus, the characteristic advantages of a ignition source are combined with those of a boost source.

The connection of the boost source and the magnetron discharge are prevented before and during ignition since the target current cannot be maintained due to the originally limited number of charge carriers. Therefore, it is not necessary for an overflow network to accept the current during this phase of separate pulses. This has a positive effect on the loss performance of the control arrangement. The introduction of the necessary discharge current immediately after a certain charge carrier distribution ensures a maximum pulse power. In order to optimize the exchange between the ignition source and the boost source, the time progression of the impedance of the magnetron discharge is collected and monitored. From the progression of each impedance, criteria are derived which determine via a control device the time of the addition of the boost source and the separation of the ignition source for each pulse phase.

Here, the impedance can be determined by measuring power and voltage directly at the electrodes of the magnetron discharge. It can also be useful to determine the best timing for adding the boost source by collecting and evaluating other parameters of the magnetron discharge. The plasma emission of the magnetron discharge, e.g., the intensity of the emitted light beams in a selected range of wave lengths, is particularly suitable for this purpose.

The generation of charge carriers during the pulsing energy introduction into a magnetron discharge and, thus, the ignition behavior as well depend in a complicated and complex manner on the material of the electrodes and the coating of the electrodes with thin layers, the type and pressure of gasses in the zone of the magnetron discharge, geometric conditions, and the intensity and shape of the magnetic field at the magnetron cathode.

Some of these parameters change during the process, which retroactively influences the generation of the charge carriers as well. Therefore, it is particularly advantageous to monitor the impedance behavior and to determine the time of the addition of the boost source for each separate pulse.

Preferably, the addition of the boost source and the separation of the ignition source from the electrodes occur simultaneously. However, it can also be useful to connect the ignition source as well as the boost source to the magnetron discharge for a certain time interval and subsequently to separate the ignition source from the magnetron discharge at a time $t_2$. During this time interval, the currents introduced by the ignition source and the boost source cumulate.

The energy introduction into a single pulse continues after the addition of the boost source until the end of the pulse-on time $t_{EIN}$. The pulse-on time can be freely selected according to the technological demands. No energy is introduced into the magnetron discharge of the pulse-off time $t_{AUS}$, a freely selected time as well. This process for creating a single pulse is repeated after the end of the pulse-off-time. Here, consecutive pulses can be provided either with the same current direction, i.e., be pulsed unipolarly, or, respectively, with an opposite current direction, i.e., be pulsed bipolarly. It is also possible to create pulse packets, in each of which one series of unipolar pulses is created, then a change of the current direction is performed and a series of unipolar pulses of the other current direction is introduced. Advantageously, one lead of the ignition source and the boost source is connected to a common reference potential.

The present invention is directed to a process for introducing pulsing energy introduction into magnetron discharges. The process includes feeding a charge to the electrodes of a magnetron arrangement via a ignition source at a time $t_0$, and, after the feeding of the electric charge, determining an ignition of the magnetron discharge. The process also includes introducing a current, having a predetermined value, from a boost source at a time $t_1$, and, at a time $t_2$, separating the ignition source from the electrodes of the magnetron arrangement. The introduction of the current by the boost source continues for a certain duration $t_{EIN}$. The process also includes interrupting the introduction of the electric energy for a predetermined time $t_{AUS}$.

According to a feature of the invention, the process can further include repeating the process. Further, time $t_1$ and time $t_2$ can be determined by the ignition of the magnetron discharge.

In accordance with another feature of the present invention, $t_2$ may be greater than or equal to $t_1$.

The process may also include adjusting, one of before and during operation, at least one of the electric charge of the ignition source and the predetermined value of the current of the boost source.

The process can also include, adjusting, one of before and during operation, at least one of the durations $t_{EIN}$ and $t_{AUS}$.

In accordance with a further feature of the instant invention, the ignition of the magnetron discharge can be determined by an impedance of the magnetron discharge.

Further, the ignition of the magnetron discharge may be determined by light emissions of the magnetron discharge.

According to still another feature of the invention, a current direction of subsequent pulses can be the same.

In accordance with a still further feature of the present invention, a current direction of subsequent pulses can be of opposite polarity.

Moreover, a current direction of a first number of pulses following one another the current direction can be the same, and, for a second number of pulses following one another after the first number of pulses, a current direction for the second number of pulses can be opposite the current direction of the first number of pulses. A change of current direction for the other pulses following one another may occur according to a predetermined program. Further, the second number of pulses is the same as the first number of pulses. Alternatively, the second number of pulses can be different from the first number of pulses.

The present invention is directed to a control arrangement for introducing pulsed energy into magnetron discharges. The control arrangement includes at least one ignition source, at least one boost source, and at least one control device arranged to selectively couple the ignition source and the boost source to electrodes of a magnetron arrangement. The control arrangement also includes a device for acquiring an ignition of the magnetron discharge, and a device for controlling the control device.

According to a feature of the instant invention, the at least one control device may couple, at least one of separately and in combination, the ignition source and the boost source to the electrodes of the magnetron arrangement.

In accordance with another feature of the invention, the ignition source may include an adjustable ignition source. Alternatively, or in addition, the boost source can include an adjustable boost source that can be adjusted.

A inductor can have a first and second connector, and the ignition source may include an adjustable direct current source having a positive and negative pole. The positive pole of the direct current source can be coupled via a first switch to the first connector of the inductor and the second connector of the inductor can be coupled to a first exit of the ignition source via a second switch. The negative pole of the direct current source can be coupled to a second exit of the ignition source, positioned on a reference potential, and a first diode may be switched parallel to a serial connection of the first switch and the inductor such that the cathode of the diode is coupled to the positive pole of the direct current source. A second diode can be switched parallel to the second switch such that its anode is coupled to the first exit of the ignition source, and a third diode can be switched between (a) a connection point of the first switch and the inductor and (b) a relational potential, such that an anode of the third diode is connected to the reference potential. The boost source may include a second adjustable direct current source having a positive and a negative pole. The positive pole of the second direct current source may be coupled to a cathode of a fourth diode and via a inductor to a side of third and fourth switches and an anode of a fifth diode. The negative pole of the second direct current source and an other side of the fourth switch may be coupled to an exit of the boost source and the reference potential, and an other side of the third switch may be coupled to an anode of the fourth diode and a cathode of the fifth diode can be coupled to another exit of the boost source.

Moreover, the exits of the ignition source and of the boost source may be coupled to a uni-phased converter in a full bridge switch control and central clamps of the full bridge switch control may be coupled to the electrodes of the magnetron arrangement.

According to another feature of the invention, the switches may include IGBTs.

In accordance with yet another feature of the present invention, in the boost source, a buffer condenser may be coupled parallel to the direct current source.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
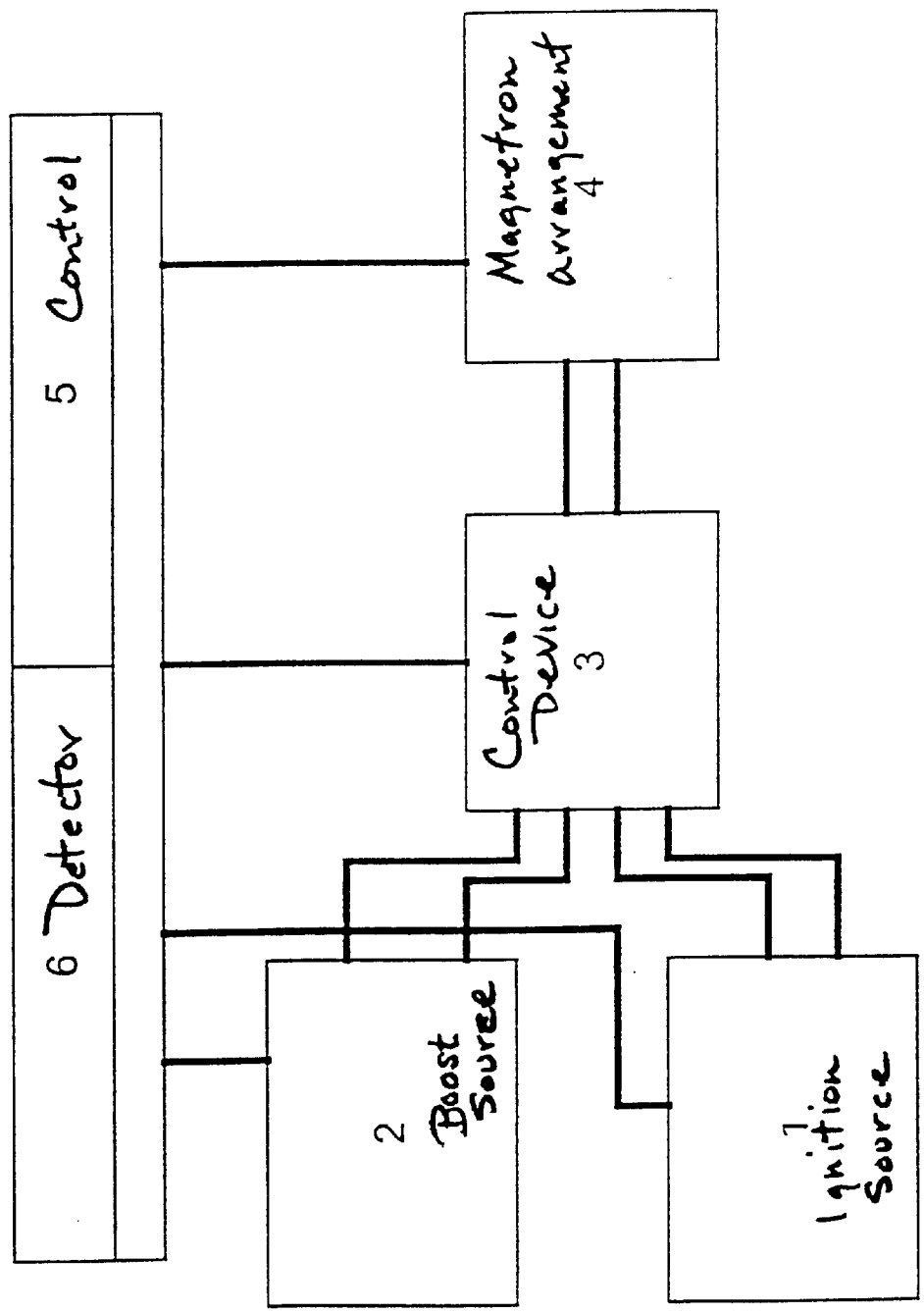
FIG. 1 illustrates a block control chart of the principal manner of the operation.

FIG. 1 shows a control arrangement according to the invention for introducing energy in the form of a block control chart. It includes an ignition source 1 having characteristics of a voltage source and adjustable voltage as well as a boost source 2 that can be controlled. It also includes a control device 3 which connects ignition source 1 and/or boost source 2 to the electrodes of a magnetron arrangement 4 including several magnetrons with corresponding targets. Cooperating with control device 3, a control 5 ensures the timely progression of the required connections between ignition source 1 and/or boost source 2 and the electrodes of magnetron arrangement 4, and thus determines the duration of the pulse-on and pulse-off times of the separate pulses, with a detector 6 enabling the determination of the best time for the addition of boost source 2 and the separation of ignition source 1 in the above-described manner.

Figure 2:
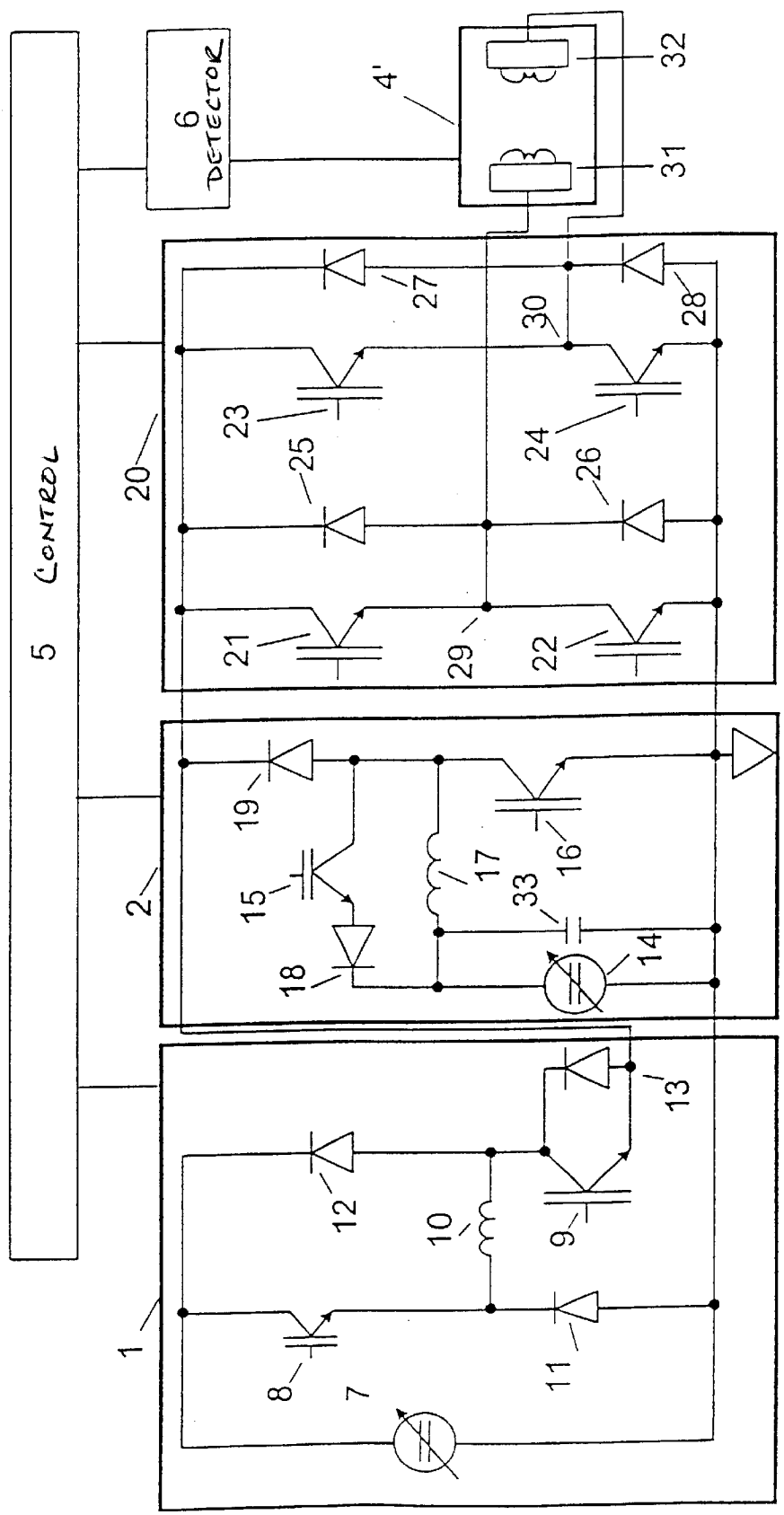
FIG. 2 illustrates a control arrangement for bipolar introduction of electrical energy into a dual-magnetron arrangement formed from two magnetron sources.

In FIG. 2, the control arrangement according to the invention is shown in an embodiment for bipolar introduction of electrical energy into a dual-magnetron arrangement 4' formed by two magnetron sources. Ignition source 1 includes, e.g., one adjustable direct current source 7, two switches 8; 9, one inductor 10 as well as three diodes 11; 12; 13. Boost source 2 includes, e.g., an additional adjustable direct current source 14, two switches 15; 16, one inductor 17, as well as two diodes 18; 19. A switching device is formed by, e.g., the switches 8; 9; 15; and 16, which are included in the ignition source 1 and the boost source 2. The bipolar pulsed operation also requires, e.g., a full bridge switching device 20 formed by additional switches 21; 22; 23; 24 and diodes 25; 26; 27; 28. Preferably, known IGBT (isolated gate bipolar transistors) are used as switches. The full bridge switching device 20 is connected to the electrodes of a magnetron arrangement 4 on its exit side. The adapted control 5 and the detector 6 for determining the best switching time, known per se and adjusted to the respective operation of the switching and/or the process, are shown only as a block.

In the following, the invention shall be explained in greater detail using this exemplary embodiment.

Magnetron arrangement 4 operated by this switching arrangement serves to coat flat glass substrates with silica via reactive spraying, utilizing a dual-magnetron system. Magnetrons 31, 32 of magnetron arrangement 4' are connected to central clamps 29 and 30 of full bridge control device 20. Both magnetrons 31, 32 are located in a vacuum chamber, not shown, and are provided with silicon targets. For spraying these targets, an inert gas, such as Argon, is guided into the vacuum chamber and energy is introduced at the clamps 29 and 30 such that a current of about 300 A, which is to be introduced into the gas discharge, is adjusted in the inductor 17 by switching on the switch 16 and the direct current source 14. In order to spray the target on the magnetron 32, a diagonal of the full bridge switching device 20 is switched on with the switches 22 and 23. The direct current source 7 is adjusted to about 800 V and switches 8 and 9 are switched on. Thus, the ignition voltage is fed between the two magnetrons 31; 32, the plasma ignites, and the discharge current increases linearly. When one of the trigger values of about 25 A, which is predetermined in control 5 and measured by detector 6, is reached, switch 16 is opened for sudden introduction of a current of about 300 A, commuting the current in inductor 17 via diode 19 into the gas discharge. Switches 8 and 9 are opened since an additional current from ignition source 1 is not necessary in the plasma. The stored energy in inductor 10 is returned into direct current source 7 via diodes 11 and 12 so that no voltage peak develops at the next ignition process. This state is maintained for a predetermined pulse-on time (about 15 $\mu$s). The voltage adjusts to the ignition voltage (approximately 470 V) of the plasma and the current is constant. This results in the maximum energy in the pulse since both values show an almost rectangular progression. In a selected pulse-off time of about 5 $\mu$s, an average power of about 105 kW results when measured using the pulse-on time and the pulse-off-time. When the pulse-on time is finished, switch 15 is turned on, thus the current commutates in the idling circle including switch 15, diode 18, and inductor 17. Switches 22 and 23 are closed; parasitic elements in the work circle are discharged to direct current source 7 via diodes 25, 28, 12, and 13. In the same manner, e.g., 100 pulses are performed.

Subsequently, another diagonal of fill bridge switching device 20 (switch 21, 24) is switched on and off for, e.g., 100 pulses with all other elements switching as mentioned above. The described progression is repeated for the duration of the coating process. In order to end the energy introduction, the switches of the full bridge switch 20 are no longer switched on, direct current sources 7 and 14 are switched off, and inductor 17 idles via switches 15 and diode 18.

Additional buffer condenser 33 represents a practical embodiment of the control arrangement according to the invention in the case that the current desired in inductor 17 is greater than the maximum current that direct current source 14 can deliver. In this case, control 5 ensures that, during the pulse-off time, buffer condenser 33 is charged and discharged in such a way that the desired current is introduced into inductor 17 as the sum of the currents originating in direct current source 14 and buffer condenser 33.

Figure 3:
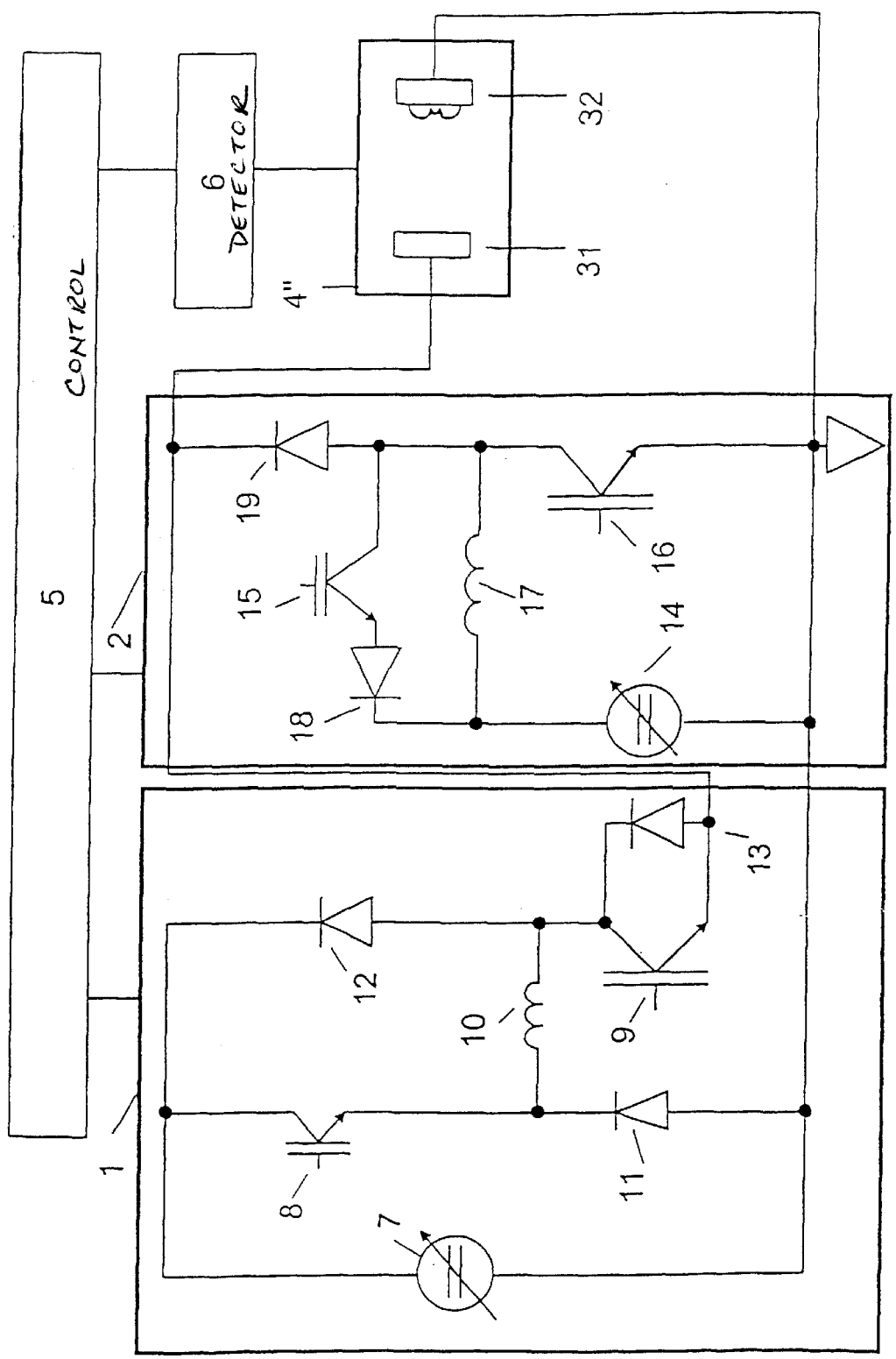
FIG. 3 illustrates a control arrangement for the unipolar introduction of electric energy into a magnetron discharge.

FIG. 3 shows the control arrangement in an embodiment for unipolar introduction of electric energy into a magnetron discharge. In the same fashion, ignition source 1 and current source 2 (without a buffer condenser), control device (switch 8; 9; 15; 16), control 5, magnetron arrangement 4", and detector 6 are shown.

For the unipolar operation the full bridge switching device used in FIG. 2 can be omitted. Magnetrons 31', 32' of magnetron arrangement 4" are directly connected with the exit clamps of boost source 2.

The switching arrangement operates in the same fashion as the switching arrangement according to FIG. 2.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may; be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A process for introducing pulsing energy introduction into magnetron discharges, said process comprising:
    feeding a charge to the electrodes of a magnetron arrangement via a ignition source at a time $t_0$;
    after the feeding of the electric charge, determining an ignition of the magnetron discharge;
    introducing a current, having a predetermined value, from a boost source at a time $t_1$;
    at a time $t_2$, separating the ignition source from the electrodes of the magnetron arrangement, wherein the introduction of the current by the boost source continues for a certain duration $t_{EIN}$; and
    interrupting the introduction of the electric energy for a predetermined time $t_{AUS}$.

2. The process in accordance with claim 1, further comprising repeating the process.

3. The process in accordance with claim 1, wherein time $t_1$ and time $t_2$ are determined by the ignition of the magnetron discharge.

4. The process in accordance with claim 1, wherein $t_2 \geq t_1$.

5. The process in accordance with claim 1, further comprising adjusting, one of before and during operation, at least one of the electric charge of the ignition source and the predetermined value of the current of the boost source.

6. The process in accordance with claim 1, further comprising adjusting, one of:before and during operation, at least one of the durations $t_{EIN}$ and $t_{AUS}$.

7. The process in accordance with claim 1, wherein the ignition of the magnetron discharge is determined by an impedance of the magnetron discharge.

8. The process in accordance with claim 1, wherein the ignition of the magnetron discharge is determined by light emissions of the magnetron discharge.

9. The process in accordance with claim 1, wherein a current direction of subsequent pulses is the same.

10. The process in accordance with claim 1, wherein a current direction of subsequent pulses are of opposite polarity.

11. The process in accordance with claim 1, wherein a current direction of a first number of pulses following one another the current direction is the same, and
    wherein, for a second number of pulses following one another after the first number of pulses, a current direction for the second number of pulses is opposite the current direction of the first number of pulses, and
    wherein a change of current direction for the other pulses following one another occurs according to a predetermined program.

12. The process in accordance with claim 11, wherein the second number of pulses is the same as the first number of pulses.

13. The process in accordance with claim 11, wherein the second number of pulses is different from the first number of pulses.

14. A control arrangement for introducing pulsed energy into magnetron discharges comprising:
    at least one pulsed ignition source;
    at least one pulsed boost source;
    at least one control device arranged to selectively couple the ignition source and the boost source to electrodes of a magnetron arrangement;
    a device for acquiring an ignition of the magnetron discharge; and
    a device for controlling said control device.

15. The control arrangement in accordance with claim 14, wherein said at least one control device couples, at least one of separately and in combination, said ignition source and said boost source to said electrodes of said magnetron arrangement.

16. The control arrangement in accordance with claim 14, wherein said ignition source comprises an adjustable ignition source.

17. The control arrangement in accordance with claim 14, wherein said boost source comprises an adjustable boost source that can be adjusted.

18. A control arrangement for introducing pulsed energy into magnetron discharges comprising:
    at least one ignition source;
    at least one boost source;
    at least one control device arranged to selectively couple the ignition source and the boost source to electrodes of a magnetron arrangement;
    a device for acquiring an ignition of the magnetron discharge;
    a device for controlling said control device;
    an inductor having a first and second connector;
    said ignition source comprising an adjustable direct current source having a positive and negative pole, wherein said positive pole of said direct current source is coupled via a first switch to said first connector of said inductor and said second connector of said inductor is coupled to a first exit of said ignition source via a second switch;
    said negative pole of said direct current source is coupled to a second exit of said ignition source, positioned on a reference potential, and a first diode is switched parallel to a serial connection of said first switch and the inductor such that the cathode of said diode is coupled to said positive pole of said direct current source;

a second diode being switched parallel to said second switch such that its anode is coupled to said first exit of said ignition source;

a third diode being switched between (a) a connection point of said first switch and said inductor and (b) a relational potential, such that an anode of said third diode is connected to said reference potential;

said boost source includes a second adjustable direct current source having a positive and a negative pole, wherein said positive pole of the second direct current source is coupled to a cathode of a fourth diode and via a inductor to a side of third and fourth switches and an anode of a fifth diode;

said negative pole of said second direct current source and an other side of said fourth switch are coupled to an exit of said boost source and said reference potential;

an other side of said third switch is coupled to an anode of said fourth diode and a cathode of said fifth diode is coupled to another exit of said boost source.

19. The control arrangement in accordance with claim 18, wherein said exits of said ignition source and of said boost source are coupled to a uni-phased converter in a full bridge switch control and central clamps of said full bridge switch control are coupled to said electrodes of said magnetron arrangement.

20. The control arrangement in accordance with claim 18, wherein said switches comprise IGBTs.

21. The control arrangement in accordance with claim 18, wherein, in said boost source, a buffer condenser is coupled parallel to said direct current source.

22. A control arrangement for introducing pulsed energy into magnetron discharges comprising:

at least one ignition source comprising a current source;

at least one boost source comprising a current source;

at least one control device arranged to selectively couple said ignition source and said boost source to electrodes of a magnetron arrangement;

a device for acquiring an ignition of the magnetron discharge; and a device for controlling said control device.

* * * * *